(12) United States Patent
Iha

(10) Patent No.: US 7,146,719 B2
(45) Date of Patent: Dec. 12, 2006

(54) MULTILAYER CIRCUIT COMPONENT AND METHOD FOR MANUFACTURING THE SAME

(75) Inventor: Michiaki Iha, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 293 days.

(21) Appl. No.: 10/815,659

(22) Filed: Apr. 2, 2004

(65) Prior Publication Data

US 2004/0185379 A1 Sep. 23, 2004

Related U.S. Application Data

(62) Division of application No. 09/881,974, filed on Jun. 15, 2001, now Pat. No. 6,759,115.

(30) Foreign Application Priority Data

Jun. 15, 2000 (JP) ............................. 2000-180086
Jul. 7, 2000 (JP) ............................. 2000-206262

(51) Int. Cl.
*H05K 3/36* (2006.01)

(52) U.S. Cl. ............................. 29/830; 29/825; 29/832; 29/852; 428/209; 428/414; 428/415

(58) Field of Classification Search .................. 29/825, 29/830, 832, 852; 428/209, 414, 415
See application file for complete search history.

(56) References Cited

U.S. PATENT DOCUMENTS

| 4,769,309 A * | 9/1988 | King et al. .................. 430/311 |
| 5,827,605 A | 10/1998 | Nishide et al. |
| 5,928,839 A * | 7/1999 | Rath et al. .................. 430/313 |
| 6,159,322 A | 12/2000 | Ogata et al. |
| 6,190,834 B1 * | 2/2001 | Narahara et al. ......... 430/284.1 |
| 6,534,723 B1 * | 3/2003 | Asai et al. .................. 174/255 |
| 6,759,115 B1 * | 7/2004 | Iha .............................. 428/210 |

FOREIGN PATENT DOCUMENTS

| GB | 2145574 A | 3/1985 |
| JP | 53008771 A | 7/1976 |
| JP | 55-62799 | 5/1980 |
| JP | 63-194395 | 8/1988 |
| JP | 63-261796 | 10/1988 |
| JP | 7-312511 | 11/1995 |

(Continued)

Primary Examiner—Carl J. Arbes
(74) Attorney, Agent, or Firm—Dickstein, Shapiro, LLP.

(57) ABSTRACT

A multilayer circuit component and a method for manufacturing the same, in which the difference of the amounts of baking shrinkages between each of the glass-containing layers is small, and the enlargement rate of the diameter of the via hole formed in each of the glass-containing layers is close to those in the other layers, so that it is possible to prevent a short circuit defect due to the mutual short circuit of the conductors in the via hole from occurring, and the warp of the substrate is reduced. The multilayer circuit component is provided with at least two glass-containing layers on a substrate, differentiating the softening temperature of glass compounded in the first glass-containing layer formed on the substrate from the softening temperature of glass compounded in the second glass-containing layer formed on the first glass-containing layer. The difference in the sintering properties due to the difference between the wettabilities is counterbalanced, and therefore, a multilayer circuit component, in which the warp of the substrate is reduced, and the degree of the enlargement of the via hole diameter of each of the glass-containing layers during baking is uniform, is produced.

20 Claims, 3 Drawing Sheets

FOREIGN PATENT DOCUMENTS

| | | |
|---|---|---|
| JP | 08-236936 | 9/1996 |
| JP | 10-65335 | 3/1998 |
| JP | 11-224825 | 8/1999 |
| JP | 11-330694 | 11/1999 |

\* cited by examiner

MULTILAYER CIRCUIT COMPONENT AND METHOD FOR MANUFACTURING THE SAME

This is a division of application Ser. No. 09/881,974, filed Jun. 14, 2001 now U.S. Pat. No. 6,759,115.

BACKGROUND OF THE INVENTION

1. Field of the Invention

The present invention relates to a multilayer circuit component and a method for manufacturing the same. In particular, the present invention relates to a multilayer circuit component having a structure in which at least two layers of glass-containing layers are provided on a substrate, and a method for manufacturing the same.

2. Description of the Related Art

Semiconductor elements, such as ICs, have hitherto been mounted on printed circuit substrates, such as glass epoxy substrates, and alumina ceramic substrates. In recent years, requirements for higher packing densities, finer wirings, higher transmission speeds, higher frequencies and higher heat dissipations of the semiconductor elements have been intensified.

Conventional printed circuit substrates, such as glass epoxy, do not always have sufficient properties regarding its through hole plating property, workability, multilayer adhesion property, thermal deformation resistance at a high temperature, etc., so that there is a limit in practice regarding the increase in density. Nevertheless, expectations for ceramic substrates having large mechanical strength and high thermal resistance are running high.

For example, an alumina substrate, which is one of the ceramic substrates, has large mechanical strength and superior thermal resistance, so that various multilayer circuit components have been developed in which fine wirings are provided on the alumina substrates, and furthermore, insulation layers provided with through holes are formed by a green sheet lamination method or a printing method.

For example, a laminated air-core coil used as an inductor is produced by repeating the steps of forming a coil (coil pattern) on an alumina substrate from a conductor paste, forming an insulation layer provided with a via hole thereon, filling the via hole with a conductor and forming a second layer of coil (coil pattern) on the insulation layer. Since a spiral type coil is produced, high inductance can be produced.

As the method for manufacturing the laminated air-core coil, a method in which a screen plate coated with a photosensitive emulsion, etc., for forming a predetermined pattern is produced, and then a paste is applied by printing on a substrate or an insulation layer through the resulting screen plate using, e.g. a squeegee, and a method in which a conductor paste having photo-hardening property is applied by printing on all over the surface of a substrate or an insulation layer with a spin coating method, etc., and then a coil is formed by exposure and development through a photomask provided with a desired pattern, are known.

As a method for forming an insulation layer provided with a via hole at which a part of a conductor pattern is exposed, in a manner similar to that in the aforementioned case of the formation of the coil, there are a method in which a coating of a paste is applied by a screen printing, and a method in which exposure and development are performed using a photosensitive paste. In addition, there is a method in which a green sheet is produced from a compound of an insulation powder and an organic binder, a through hole is formed by punching at a predetermined location of the green sheet, and thereafter, this is stacked on a substrate or an insulation layer provided with a conductor and is pressure-bonded.

For example, in the formation of a plurality of insulation layers containing glass on a ceramic sintered substrate made of alumina, etc., each of the insulation layers has been hitherto formed using the same material containing the same glass. When each of the insulation layers is, however, conventionally formed by coating and baking of a material in which the same type of glass is compounded, the wettability of the first insulation layer (first glass-containing layer) formed on the ceramic sintered substrate made of alumina, etc., relative to the sintered substrate and the wettability of the second insulation layer (second glass-containing layer) formed on the first glass-containing layer relative to the first glass-containing layer are different. This difference in the wettability affects the sinterability of each of the glass-containing layers to a large degree. That is, since large differences in the amount of baking shrinkages and in the shrinkage behavior occur due to the difference in the sinterability between the first glass-containing layer and the second glass-containing layer, there are problems in that remarkable warps occur in the substrates, and in particular, when the via hole is formed in each of the insulation layer, the diameter of the via hole is enlarged.

Table 1 shows wettabilities (contact angles) of borosilicate glass relative to an alumina substrate, a crystalline quartz ($SiO_2$) substrate and a borosilicate glass substrate. The wettability of the glass can be evaluated by the contact angle, and when the wettability becomes better, the contact angle decreases.

TABLE 1

| Substrate | Contact angle of borosilicate glass ($SiO_2:B_2O_3:K_2O$ = 79:19:2) relative to substrate at 1,000° C. |
| --- | --- |
| Alumina | 48° |
| $SiO_2$(Crystalline Quartz) | 140° |
| Borosilicate Glass ($SiO_2:B_2O_3:K_2O$ = 79:19:2) | 8° |

As shown in Table 1, the contact angle of the borosilicate glass relative to the alumina substrate, frequently used as the substrate of the multilayer circuit component, is 48°, the contact angle of the borosilicate glass relative to the crystalline quartz ($SiO_2$) substrate is 140°, and the contact angle of the borosilicate glass relative to the borosilicate glass substrate (the contact angle of borosilicate glasses relative to each other) is 8°. Therefore, when comparisons are made between the alumina substrate and the borosilicate glass substrate, it is clear that the wettability of the glass relative to the alumina substrate is inferior by a large degree.

As a consequence, when the insulation layers (glass-containing layers) are laminated on the alumina substrate by a sequential baking method, in which the layers are baked one by one, since the insulation layer at the first layer (the first glass-containing layer) is baked on the alumina substrate, viscous flow is not likely to occur and the sinterability tends to be inferior. On the other hand, since the insulation layer at the second layer (the second glass-containing layer) formed on the first glass-containing layer is baked on the first glass-containing layer having excellent wettability, viscous flow starts early on, so that the sintering is likely to be accelerated compared to that in the case in which the first glass-containing layer is baked on the alumina substrate.

When the sinterability of the second glass-containing layer is improved, the baking shrinkages in the second glass-containing layer and glass-containing layers thereafter are accelerated, so that the diameters of the formed via holes become larger than that in the first layer. Accordingly, the exposure region is increased in excess of the required exposure region, and sometimes, not only the conductor pattern planned to be exposed, but also the conductor pattern adjacent thereto is exposed, so that when the via hole is filled with the conductor, a short circuit with the adjacent conductor pattern may occur, i.e., there is a circuit defect.

FIG. 1 shows a state of an insulation layer (the first glass-containing layer) 54a, provided with a via hole 53a and formed by applying a coating of an insulation material paste containing glass on a substrate 51, on which a conductor pattern (circuit) 52a is formed, and by baking, according to a conventional process for manufacturing a multilayer circuit component. FIG. 2 shows a state of an insulation layer (the second glass-containing layer) 54b, provided with a via hole 53b and formed by applying an insulation material paste containing glass on the first glass-containing layer 54a, on which conductor patterns (circuits) 52b and 52c are provided, and by baking.

As shown in FIGS. 1 and 2, according to the aforementioned conventional method for manufacturing the multilayer circuit component in which the same insulation material paste, with the same glass being compounded, is applied by coating and is baked, the baking shrinkage in the second glass-containing layer 54b is accelerated, so that the diameter of the via hole 53b of the second glass-containing layer 54b becomes larger than that of the via hole 53a in the first glass-containing layer 54a. Accordingly, when the via hole conductor 55 is introduced from the via hole 53b, there is a problem in that the via hole conductor 55 is not only connected to the planned conductor pattern 52b, but also short-circuited with the adjacent conductor patterns 52c exposed at the via hole 53b, so as to cause the short circuit defect.

Furthermore, since the residual stress of the substrate is unevenly generated due to the difference in the amounts of baking shrinkages, even when the properties, such as the thermal expansion and the thermal shrinkage, of the glass constituting the first glass-containing layer coincide with those of the substrate, the degree of the thermal shrinkage in the second glass-containing layer formed on the first glass-containing layer is different from that in the first glass-containing layer, so that a warp occurs in the substrate, and there is a problem in that the manufacture of the multilayer circuit component is difficult.

SUMMARY OF THE INVENTION

The present invention was made to solve the aforementioned problems. Accordingly, it is an object of the present invention to provide a multilayer circuit component and a method for manufacturing the same in which the difference of the amounts of baking shrinkages between each of the glass-containing layers is small and the enlargement rate of the diameter of the via hole formed in each of the glass-containing layers is close to those in the other layers, so that it is possible to prevent the short circuit defect due to the mutual short circuit of the conductors in the via hole from occurring, and the warp of the substrate is reduced.

In order to achieve the aforementioned objects, according to an aspect of the present invention, a multilayer circuit component provided with at least two layers of glass-containing layers composed of materials containing glass on a substrate is provided in which among the at least two layers of glass-containing layers, the softening temperature of glass compounded in the first glass-containing layer formed on the substrate and the softening temperature of glass compounded in the second glass-containing layer formed on the aforementioned first glass-containing layer are different.

By differentiating the softening temperature (Ts) of the glass compounded in the first glass-containing layer formed on the substrate from the softening temperature of the glass compounded in the second glass-containing layer formed on the first glass-containing layer, it is possible to control the wettabilities relative to the substrate, the glass-containing layer, etc., on which each of the glass-containing layers are to be formed, so as to prevent the amount of baking shrinkages of the first glass-containing layer and the second glass-containing layer from being uneven, and when the via hole is formed in the glass-containing layer, it is possible to suppress the enlargement of the via hole diameter, so as to make the degree of the enlargement of the via hole diameter in each of glass-containing layer small, to prevent the short circuit defect with adjacent conductors from occurring, and furthermore, it is possible to provide a multilayer circuit component in which the warp of the substrate is reduced.

In the present invention, the glass-containing layer includes a layer made of glass only and a layer made of the material in which glass is compounded in the inorganic component, for example, ceramic particles.

In the multilayer circuit component according to the present invention, when the contact angle of the glass constituting the aforementioned first glass-containing layer relative to the aforementioned substrate is larger than the contact angle of the glass constituting the aforementioned second glass-containing layer relative to the aforementioned first glass-containing layer, the softening temperature of the glass compounded in the aforementioned first glass-containing layer is preferably made to be lower than the softening temperature of the glass compounded in the aforementioned second glass-containing layer.

When the contact angle of the glass constituting the first glass-containing layer relative to the substrate is larger than the contact angle of the glass constituting the second glass-containing layer relative to the first glass-containing layer, that is, when the wettability of the glass constituting the first glass-containing layer relative to the substrate is inferior to the wettability of the glass constituting the second glass-containing layer relative to the first glass-containing layer, and when the softening temperature of the glass compounded in the first glass-containing layer is made to be lower than the softening temperature of the glass compounded in the second glass-containing layer, it is possible that the wettability of the first glass-containing layer relative to the substrate is improved, while the wettability of the second glass-containing layer relative to the first glass-containing layer is reduced, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layers so as to prevent the short circuit defect with adjacent conductors from occurring, and furthermore, it is possible to provide the multilayer circuit component in which the warp of the substrate is reduced.

On the other hand, when the contact angle of the glass constituting the aforementioned first glass-containing layer relative to the aforementioned substrate is smaller than the contact angle of the glass constituting the aforementioned second glass-containing layer relative to the aforementioned first glass-containing layer, the softening temperature of the glass compounded in the aforementioned first glass-containing layer is preferably higher than the softening temperature of the glass compounded in the second glass-containing layer.

That is, when the contact angle of the glass constituting the first glass-containing layer relative to the substrate is smaller than the contact angle of the glass constituting the second glass-containing layer relative to the first glass-containing layer, that is, when the wettability of the glass constituting the first glass-containing layer relative to the substrate is superior to the wettability of the glass constituting the second glass-containing layer relative to the first glass-containing layer, and the softening temperature of the glass compounded in the first glass-containing layer is made to be higher than the softening temperature of the glass compounded in the second glass-containing layer, it is possible that the wettability of the first glass-containing layer relative to the substrate is reduced, while the wettability of the second glass-containing layer relative to the first glass-containing layer is improved, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layers so as to prevent the short circuit defect with adjacent conductors from occurring, and furthermore, it is possible to provide the multilayer circuit component in which the warp of the substrate is reduced.

The difference between the softening temperature of the glass compounded in the aforementioned first glass-containing layer and the softening temperature of the glass compounded in the aforementioned second glass-containing layer is preferably about 30° C. or more.

When the difference between the softening temperature of the glass compounded in the first glass-containing layer and the softening temperature of the glass compounded in the second glass-containing layer is made to be about 30° C. or more, it is possible to significantly control the wettability of the first glass-containing layer relative to the substrate and the wettability of the second glass-containing layer relative to the first glass-containing layer, so as to counterbalance the difference in the sintering properties due to the difference between the wettabilities of each of the glass-containing layers, and to reduce the difference in the amounts of the baking shrinkages of the first and the second glass-containing layers. Therefore, the effects of the present invention can be exhibited in practice.

According to another aspect of the present invention, a method for manufacturing a multilayer circuit component provided with at least two layers of glass-containing layers composed of materials containing glass on a substrate, in which among the at least two layers of glass-containing layers, the softening temperature of glass compounded in the first glass-containing layer formed on the substrate and the softening temperature of glass compounded in the second glass-containing layer formed on the first glass-containing layer are different, is provided. The aforementioned method for manufacturing the multilayer circuit component is provided with the steps of at least (a) applying a photosensitive glass paste composed of the glass having a predetermined softening temperature or a compound of the glass having the predetermined softening temperature and an oxide, and a photosensitive vehicle, by printing on a substrate and then drying, (b) exposing and developing a via hole pattern using a predetermined mask on the resulting printed and dried paste layer, (c) baking the resulting paste layer with the aforementioned exposed and developed via hole pattern so as to form the first glass-containing layer, (d) applying a photosensitive glass paste composed of glass having a softening temperature different from the softening temperature of the glass in the aforementioned first glass-containing layer and a photosensitive vehicle by printing on the aforementioned first glass-containing layer and drying, (e) exposing and developing a via hole pattern using a predetermined mask on the resulting printed and dried paste layer, and (f) baking the resulting paste layer with the aforementioned exposed and developed via hole pattern so as to form the second glass-containing layer.

By forming each of the glass-containing layers by way of the aforementioned steps (a) to (f), the multilayer circuit component provided with at least two layers of glass-containing layers composed of materials containing glass on a substrate can be reliably produced, in which among the at least two layers of glass-containing layers, at least the softening temperature of the glass compounded in the first glass-containing layer formed on the substrate and the softening temperature of the glass compounded in the second glass-containing layer formed on the first glass-containing layer are different, the degree of the enlargement of the via hole diameter in each of the glass-containing layer is small, the short circuit defect with adjacent conductors is prevented from occurring and the warp of the substrate is reduced.

As the photosensitive glass paste, a photosensitive glass paste in which an inorganic component and a photosensitive vehicle are compounded in the weight ratio of about 40:60 to 70:30, is preferably used. The ratio of the inorganic component is more preferably made to be in the range of about 50:50 to 55:45.

As the photosensitive glass paste, for example, a photosensitive glass paste, in which the inorganic component and the photosensitive vehicle are dispersed using a triple roller mill can be used.

As the photosensitive vehicle usable in the present invention, a compound of a co-polymer of methyl methacrylate and methacrylic acid, a monomer, a photo initiator and a solvent, etc., can be used, although there is no particular limitation regarding specified kinds thereof.

In the method for manufacturing the multilayer circuit component according to the present invention, when the contact angle of the glass constituting the aforementioned first glass-containing layer relative to the aforementioned substrate is larger than the contact angle of the glass constituting the aforementioned second glass-containing layer relative to the aforementioned first glass-containing layer, the softening temperature of the glass in the photosensitive glass paste used for forming the aforementioned first glass-containing layer is preferably made to be lower than the softening temperature of the glass in the photosensitive glass paste used for forming the aforementioned second glass-containing layer.

When the contact angle of the glass constituting the first glass-containing layer relative to the substrate is larger than the contact angle of the glass constituting the second glass-containing layer relative to the first glass-containing layer, by making the softening temperature of the glass in the photosensitive glass paste used for forming the first glass-containing layer lower than the softening temperature of the glass in the photosensitive glass paste used for forming the second glass-containing layer, it is possible that the wettability of the first glass-containing layer relative to the substrate is improved, while the wettability of the second glass-containing layer relative to the first glass-containing layer is reduced, so as to counterbalance the difference in the sintering properties due to the difference between the wettabilities of each of the glass-containing layers and to reduce the difference in the amounts of the baking shrinkages of the first and the second glass-containing layers. As a result, it is possible to suppress the enlargement of the via hole diameter in each of the glass-containing layers, so as to efficiently produce the multilayer circuit component in which the short circuit defect with adjacent conductors is prevented from occurring, and furthermore, the warp of the substrate is reduced.

On the other hand, when the contact angle of the glass constituting the aforementioned first glass-containing layer relative to the aforementioned substrate is smaller than the contact angle of the glass constituting the aforementioned second glass-containing layer relative to the aforementioned first glass-containing layer, the softening temperature of the glass in the photosensitive glass paste used for forming the aforementioned first glass-containing layer is preferably made to be higher than the softening temperature of the glass in the photosensitive glass paste used for forming the aforementioned second glass-containing layer.

When the contact angle of the glass constituting the first glass-containing layer relative to the substrate is smaller than the contact angle of the glass constituting the second glass-containing layer relative to the first glass-containing layer, by making the softening temperature of the glass in the photosensitive glass paste used for forming the first glass-containing layer higher than the softening temperature of the glass in the photosensitive glass paste used for forming the second glass-containing layer, it is possible that the wettability of the first glass-containing layer relative to the substrate is reduced, while the wettability of the second glass-containing layer relative to the first glass-containing layer is improved, so as to counterbalance the difference in the sintering properties due to the difference between the wettabilities of each of the glass-containing layers and to reduce the difference in the amounts of the baking shrinkages of the first and the second glass-containing layers. As a result, it is possible to suppress the enlargement of the via hole diameter in each of the glass-containing layers, so as to efficiently produce the multilayer circuit component in which the short circuit defect with adjacent conductors is prevented from occurring, and furthermore, the warp of the substrate is reduced.

In the method for manufacturing the multilayer circuit component according to the present invention, the difference between the softening temperature of the glass in the photosensitive glass paste used for forming the first glass-containing layer and the softening temperature of the glass in the photosensitive glass paste used for forming the second glass-containing layer is preferably about 30° C. or more.

By making the difference between the softening temperature of the glass in the photosensitive glass paste used for forming the first glass-containing layer and the softening temperature of the glass in the photosensitive glass paste used for forming the second glass-containing layer about 30° C. or more, it is possible to significantly control the wettability of the first glass-containing layer relative to the substrate and the wettability of the second glass-containing layer relative to the first glass-containing layer, so as to counterbalance the difference in the sintering properties due to the difference between the wettabilities of each of the glass-containing layers, and to reduce the difference in the amounts of the baking shrinkages of the first and the second glass-containing layers. Therefore, the effects of the present invention can be exhibited in practice.

In the method for manufacturing the multilayer circuit component according to the present invention, it is preferable that the baking is performed after every paste layer is formed by way of the aforementioned steps of the printing and drying, and developing.

When baking is performed after every paste layer is formed by way of the aforementioned steps of the printing and drying, and developing (so-called sequential baking), the present invention is especially significant since it is possible to suppress the enlargement of the via hole diameter in each of the glass-containing layers, so as to efficiently produce the multilayer circuit component in which the short circuit defect with adjacent conductors is prevented from occurring, and furthermore, the warp of the substrate is reduced.

In order to achieve the aforementioned objects, according to another aspect of the present invention, a multilayer circuit component provided with at least two layers of glass-containing layers composed of materials containing glass and ceramic on a substrate is provided, in which among the at least two layers of glass-containing layers, at least the first glass-containing layer formed on the substrate and the second glass-containing layer formed on the aforementioned first glass-containing layer are different in glass content.

By differentiating the glass content of at least the first glass-containing layer formed on the substrate, in particular, on a ceramic sintered substrate, among the at least two layers of glass-containing layers, and the second glass-containing layer formed thereon, it is possible to control the wettabilities relative to the substrate, the glass-containing layer, etc., on which each of the glass-containing layers are to be formed, so as to prevent the amounts of baking shrinkages of the first glass-containing layer and the second glass-containing layer from being uneven, and when a via hole is formed in the glass-containing layer, it is possible to suppress the enlargement of the via hole diameter, so as to prevent the short circuit defect between conductors through the via hole conductor from occurring, and furthermore, it is possible to provide a multilayer circuit component in which the warp of the substrate is reduced.

In the multilayer circuit component according to the present invention, the glasses contained in the aforementioned first glass-containing layer and the aforementioned second glass-containing layer are preferably low softening temperature glasses.

When the glasses contained in the aforementioned first glass-containing layer and the aforementioned second glass-containing layer are low softening temperature glasses, by differentiating the contents of the low softening temperature glasses in the first glass-containing layer and in the second glass-containing layer, it is possible to control the wettabilities relative to the substrate and the glass-containing layer, etc., on which each of the glass-containing layers are formed, so as to prevent the amounts of baking shrinkages of the first glass-containing layer and the second glass-containing layer from being uneven. Consequently, it is possible to provide a multilayer circuit component in which the short circuit defect between conductors is prevented from occurring, and the warp of the substrate is reduced.

According to another aspect of the present invention, a multilayer circuit component provided with at least two layers of glass-containing layers composed of materials containing glass on a substrate is provided, in which at least the first glass-containing layer, formed on the substrate, among the at least two layers of glass-containing layers and the second glass-containing layer formed on the aforementioned first glass-containing layer contain compounded glasses composed of at least two kinds of low softening temperature glass, and the compounded glass contained in the aforementioned first glass-containing layer and the compounded glass contained in the aforementioned second glass-containing layer are different in the compounding ratios of the low softening temperature glasses. By the term low softening temperature glass is mean a glass having a softening temperature below about 650° C., and preferably below about 500° C.

By making at least the first glass-containing layer formed on the substrate and the second glass-containing layer formed thereon contain compounded glasses composed of at least two kinds of low softening temperature glass, and by differentiating the compounding ratios of the low softening temperature glasses in the compounded glasses contained in the first glass-containing layer and the second glass-containing layer, it is possible to control the wettabilities relative to the substrate and the glass-containing layer, etc., on which each of the glass-containing layers are to be formed, so as to prevent the amounts of baking shrinkages of the first glass-containing layer and the second glass-containing layer from being uneven, and when a via hole is formed in the glass-containing layer, it is possible to suppress the enlargement of the via hole diameter so as to prevent the short circuit defect between conductors through the via hole conductor from occurring, and furthermore, it is possible to provide the multilayer circuit component in which the warp of the substrate is reduced.

According to another aspect of the present invention, a multilayer circuit component provided with at least two layers of glass-containing layers composed of materials containing glass and ceramic on a substrate is provided in which at least the first glass-containing layer formed on the substrate, and the second glass-containing layer formed on the aforementioned first glass-containing layer contain compounded glasses composed of at least two kinds of low softening temperature glass, and the aforementioned first glass-containing layer and the aforementioned second glass-containing layer are different in the content of the aforementioned compounded glasses.

By making at least the first glass-containing layer formed on the substrate and the second glass-containing layer formed thereon contain compounded glasses composed of at least two kinds of low softening temperature glass, and by differentiating the contents of the compounded glasses in the first glass-containing layer and the second glass-containing layer, it is possible to control the wettabilities relative to the substrate and the glass-containing layer, etc., on which each of the glass-containing layers are to be formed, so as to prevent the amounts of baking shrinkages of the first glass-containing layer and the second glass-containing layer from being uneven, and when the via hole is formed in the glass-containing layer, it is possible to suppress the enlargement of the via hole diameter, so as to prevent the short circuit defect between conductors through the via hole conductor from occurring, and furthermore, it is possible to provide the multilayer circuit component in which the warp of the substrate is reduced.

When the contact angle of the glass constituting the aforementioned first glass-containing layer in the aforementioned multilayer circuit component relative to the aforementioned substrate is larger than the contact angle of the glass constituting the aforementioned second glass-containing layer relative to the aforementioned first glass-containing layer, the glass content of the aforementioned first glass-containing layer is preferably made to be larger than the glass content of the aforementioned second glass-containing layer.

When the contact angle of the glass constituting the first glass-containing layer relative to the substrate is larger than the contact angle of the glass constituting the second glass-containing layer relative to the first glass-containing layer, that is, when the wettability of the glass constituting the first glass-containing layer relative to the substrate is inferior to the wettability of the glass constituting the second glass-containing layer relative to the first glass-containing layer, and when the glass content of the first glass-containing layer is made to be larger than the glass content of the second glass-containing layer, it is possible that the wettability of the first glass-containing layer relative to the substrate is improved while the wettability of the second glass-containing layer relative to the first glass-containing layer is reduced, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layers, so as to prevent the short circuit defect between the conductors from occurring, and furthermore, it is possible to produce the multilayer circuit component in which the warp of the substrate is reduced.

When a contact angle of the glass constituting the aforementioned first glass-containing layer in the aforementioned multilayer circuit component relative to the aforementioned substrate is smaller than a contact angle of the glass constituting the aforementioned second glass-containing layer relative to the aforementioned first glass-containing layer, the content of the low softening temperature glass in the aforementioned first glass-containing layer is preferably made to be smaller than the content of the low softening temperature glass in the aforementioned second glass-containing layer.

That is, when the contact angle of the glass constituting the first glass-containing layer relative to the substrate is smaller than the contact angle of the glass constituting the second glass-containing layer relative to the first glass-containing layer, that is, when the wettability of the glass constituting the first glass-containing layer relative to the substrate is superior to the wettability of the glass constituting the second glass-containing layer relative to the first glass-containing layer, and when the content of the low softening temperature glass in the first glass-containing layer is made to be smaller than the content of the low softening temperature glass in the second glass-containing layer, it is possible that the wettability of the first glass-containing layer relative to the substrate is reduced while the wettability of the second glass-containing layer relative to the first glass-containing layer is improved, so as to counterbalance the difference in the sintering properties due to the difference between the wettabilities of each of the glass-containing layers, and to reduce the difference in the amounts of the baking shrinkages of the first and the second glass-containing layers. As a result, when the via hole is formed in the glass-containing layer, it is possible to suppress the enlargement of the via hole diameter, so as to prevent the short circuit defect between the conductors through the via hole conductor from occurring, and furthermore, it is possible to produce the multilayer circuit component in which the warp of the substrate is reduced.

When the contact angle of the glass constituting the aforementioned first glass-containing layer relative to the aforementioned substrate is larger than the contact angle of the glass constituting the aforementioned second glass-containing layer relative to the aforementioned first glass-containing layer, the compounding ratio of the low softening temperature glass in the aforementioned first glass-containing layer is preferably made to be larger than the compounding ratio of the low softening temperature glass in the aforementioned second glass-containing layer.

When the contact angle of the glass constituting the first glass-containing layer relative to the substrate is larger than the contact angle of the glass constituting the second glass-containing layer relative to the first glass-containing layer, that is, when the wettability of the glass constituting the first glass-containing layer relative to the substrate is inferior to the wettability of the glass constituting the second glass-containing layer relative to the first glass-containing layer, and when the compounding ratio of the low softening temperature glass in the compounded glass of the first glass-containing layer is made to be larger than the compounding ratio of the low softening temperature glass in the compounded glass of the second glass-containing layer, it is possible that the wettability of the first glass-containing layer relative to the substrate is improved while the wettability of the second glass-containing layer relative to the first glass-containing layer is reduced, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layer, so as to prevent the short circuit defect between the conductors from occurring, and furthermore, it is possible to produce the multilayer circuit component in which the warp of the substrate is reduced.

When the contact angle of the glass constituting the aforementioned first glass-containing layer relative to the aforementioned substrate is smaller than the contact angle of the glass constituting the aforementioned second glass-containing layer relative to the aforementioned first glass-containing layer, the compounding ratio of the low softening temperature glass in the compounded glass of the aforementioned first glass-containing layer is preferably made to be smaller than the compounding ratio of the low softening temperature glass in the compounded glass of the aforementioned second glass-containing layer.

That is, when the contact angle of the glass constituting the first glass-containing layer relative to the substrate is smaller than the contact angle of the glass constituting the second glass-containing layer relative to the first glass-containing layer, that is, when the wettability of the glass constituting the first glass-containing layer relative to the substrate is superior to the wettability of the glass constituting the second glass-containing layer relative to the first glass-containing layer, and when the compounding ratio of the low softening temperature glass in the compounded glass of the first glass-containing layer is made to be smaller than the compounding ratio of the low softening temperature glass in the compounded glass of the second glass-containing layer, it is possible that the wettability of the first glass-containing layer relative to the substrate is reduced while the wettability of the second glass-containing layer relative to the first glass-containing layer is improved, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layer so as to prevent the short circuit defect between the conductors from occurring, and furthermore, it is possible to produce the multilayer circuit component in which the warp of the substrate is reduced.

When the contact angle of the glass constituting the aforementioned first glass-containing layer relative to the aforementioned substrate is larger than the contact angle of the glass constituting the aforementioned second glass-containing layer relative to the aforementioned first glass-containing layer, the content of the compounded glass in the aforementioned first glass-containing layer is preferably made to be larger than the content of the compounded glass in the aforementioned second glass-containing layer.

When the contact angle of the glass constituting the first glass-containing layer relative to the substrate is larger than the contact angle of the glass constituting the second glass-containing layer relative to the first glass-containing layer, that is, when the wettability of the glass constituting the first glass-containing layer relative to the substrate is inferior to the wettability of the glass constituting the second glass-containing layer relative to the first glass-containing layer, and when the content of the compounded glass in the first glass-containing layer is made to be larger than the content of the compounded glass in the second glass-containing layer, it is possible that the wettability of the first glass-containing layer relative to the substrate is improved while the wettability of the second glass-containing layer relative to the first glass-containing layer is reduced, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layer, so as to prevent the short circuit defect between the conductors from occurring, and furthermore, it is possible to produce the multilayer circuit component in which the warp of the substrate is reduced.

When the contact angle of the glass constituting the aforementioned first glass-containing layer relative to the aforementioned substrate is smaller than the contact angle of the glass constituting the aforementioned second glass-containing layer relative to the aforementioned first glass-containing layer, the content of the compounded glass in the aforementioned first glass-containing layer is preferably made to be smaller than the content of the compounded glass in the aforementioned second glass-containing layer.

When the contact angle of the glass constituting the first glass-containing layer relative to the substrate is smaller than the contact angle of the glass constituting the second glass-containing layer relative to the first glass-containing layer, that is, when the wettability of the glass constituting the first glass-containing layer relative to the substrate is superior to the wettability of the glass constituting the second glass-containing layer relative to the first glass-containing layer, and when the content of the compounded glass in the first glass-containing layer is made to be smaller than the content of the compounded glass in the second glass-containing layer, it is possible that the wettability of the first glass-containing layer relative to the substrate is reduced while the wettability of the second glass-containing layer relative to the first glass-containing layer is improved, so as to counterbalance the difference in the sintering properties due to the difference between the wettabilities of each of the glass-containing layers, and to reduce the difference in the amounts of the baking shrinkages of the first and the second glass-containing layers. As a result, it is possible to suppress the enlargement of the via hole diameter in each of the glass-containing layer, so as to prevent the short circuit defect between the conductors from occurring, and furthermore, it is possible to produce the multilayer circuit component in which the warp of the substrate is reduced.

According to another aspect of the present invention, a method for manufacturing a multilayer circuit component provided with at least two glass-containing layers composed of materials containing glass and ceramic on a substrate is provided. The aforementioned method for manufacturing the multilayer circuit component is provided with the steps of at least (a) applying a photosensitive glass paste composed of glass, ceramic and a photosensitive vehicle by printing on a substrate and then drying, (b) exposing and developing a via hole pattern using a predetermined mask on the resulting printed and dried paste layer, (c) baking the resulting paste layer with the aforementioned exposed and developed via hole pattern so as to form the first glass-containing layer, (d) applying a photosensitive glass paste composed of glass, ceramic and a photosensitive vehicle, in contents different from those in the aforementioned first glass-containing layer, by printing on the aforementioned first glass-containing layer and then drying, (e) exposing and developing a via hole pattern using a predetermined mask on the resulting printed and dried paste layer, and (f) baking the resulting paste layer with the aforementioned exposed and developed via hole pattern so as to form the second glass-containing layer.

By forming each of the glass-containing layers with the aforementioned steps (a) to (f), the multilayer circuit component provided with at least two layers of glass-containing layers composed of materials containing glass on a substrate can be reliably produced, in which the first glass-containing layer formed on the substrate and the second glass-containing layer formed thereon are different in glass content, the unevenness in the amounts of the baking shrinkages of the first and the second glass-containing layers is reduced, the degree of the enlargement of the via hole diameter in each of the glass-containing layer is reduced by a great degree, the short circuit defect between the conductors is prevented from occurring and the warp of the substrate is reduced.

The glass constituting the photosensitive glass paste used for forming the aforementioned first glass-containing layer and the glass constituting the photosensitive glass paste used for forming the aforementioned second glass-containing layer are preferably low softening temperature glasses.

In the case in which the glass constituting the photosensitive glass paste used for forming the first glass-containing layer and the glass constituting the photosensitive glass paste used for forming the second glass-containing layer are low softening temperature glasses, by differentiating the glass contents of the first glass-containing layer and the second glass-containing layer, a multilayer circuit component in which the unevenness in the amounts of the baking shrinkages of the first and the second glass-containing layers is reduced, the degree of the enlargement of the via hole diameter in each of the glass-containing layer is reduced by a great degree, the short circuit defect between the conductors is prevented from occurring and the warp of the substrate is reduced can be reliably produced.

As the photosensitive glass paste, a photosensitive glass paste in which an inorganic component and a photosensitive vehicle are compounded in the weight ratio of about 40:60 to 70:30, is preferably used. The ratio of the inorganic component is more preferably made to be about 50:50 to 55:45.

As the photosensitive glass paste, for example, a photosensitive glass paste in which the inorganic component and the photosensitive vehicle are dispersed using a triple roller mill, etc., can be used.

As the photosensitive vehicle usable in the present invention, a compound of a co-polymer of methyl methacrylate and methacrylic acid, a monomer, a photo initiator and a solvent, etc., can be used, although there is no particular limitation regarding specified kinds thereof.

According to another aspect of the present invention, a method for manufacturing a multilayer circuit component provided with at least two layers of glass-containing layers composed of materials containing glass on a substrate is provided. The aforementioned method for manufacturing the multilayer circuit component is provided with the steps of at least (a) applying a photosensitive glass paste composed of a compounded glass, containing at least two kinds of glasses including a low softening temperature glass, and a photosensitive vehicle by printing on a substrate, and then, drying, (b) exposing and developing a via hole pattern using a predetermined mask on the resulting printed and dried paste layer, (c) baking the resulting paste layer with the aforementioned exposed and developed via hole pattern so as to form the first glass-containing layer, (d) applying a photosensitive glass paste composed of a compounded glass having a compounding ratio of a low softening temperature glass different from that in the compounded glass contained in the aforementioned first glass-containing layer, and a photosensitive vehicle, by printing on the aforementioned first glass-containing layer, and then, drying, (e) exposing and developing a via hole pattern using a predetermined mask on the resulting printed and dried paste layer, and (f) baking the resulting paste layer with the aforementioned exposed and developed via hole pattern so as to form the second glass-containing layer.

By forming each of the glass-containing layers with the aforementioned steps (a) to (f), a multilayer circuit component provided with at least two layers of glass-containing layers composed of materials containing glass on a substrate can be reliably produced, in which the first glass-containing layer formed on the substrate and the second glass-containing layer formed thereon are different in the compounding ratios of the low softening temperature glasses in the compounded glasses, the unevenness in the amounts of the baking shrinkages of the first and the second glass-containing layers is reduced, the degree of the enlargement of the via hole diameter in each of the glass-containing layer is reduced by a great degree, the short circuit defect with the adjacent conductor is prevented from occurring and the warp of the substrate is reduced.

According to another aspect of the present invention, a method for manufacturing a multilayer circuit component provided with at least two layers of glass-containing layers composed of materials containing glass and ceramic on a substrate is provided. The aforementioned method for manufacturing the multilayer circuit component is provided with the steps of at least (a) applying a photosensitive glass paste composed of compounded glass, containing at least two kinds of glasses including a low softening temperature glass, and a photosensitive vehicle by printing on a substrate and then drying, (b) exposing and developing a via hole pattern using a predetermined mask on the resulting printed and dried paste layer, (c) baking the resulting paste layer with the aforementioned exposed and developed via hole pattern so as to form the first glass-containing layer, (d) applying a photosensitive glass paste composed of a compounded glass in a content different from that of the compounded glass in the aforementioned first glass-containing layer, and a photosensitive vehicle, by printing on the aforementioned first glass-containing layer and then drying, (e) exposing and developing a via hole pattern using a predetermined mask on the resulting printed and dried paste layer, and (f) baking the resulting paste layer with the aforementioned exposed and developed via hole pattern so as to form the second glass-containing layer.

By forming each of the glass-containing layers with the aforementioned steps (a) to (f), a multilayer circuit component provided with at least two layers of glass-containing layers composed of materials containing glass on a substrate can be reliably produced, in which at least the first glass-containing layer, formed on the substrate, among the at least two layers of glass-containing layers and the second glass-containing layer formed thereon are different in the contents of the compounded glasses, the unevenness in the amounts of the baking shrinkages of the first and the second glass-containing layers is reduced, the degree of the enlargement of the via hole diameter in each of the glass-containing layer is reduced by a great degree, the short circuit defect with the adjacent conductor is prevented from occurring and the warp of the substrate is reduced.

DESCRIPTION OF THE PREFERRED EMBODIMENTS

The features of the present invention will be explained below in detail using embodiments according to the present invention.

First Embodiment

Figure 1:
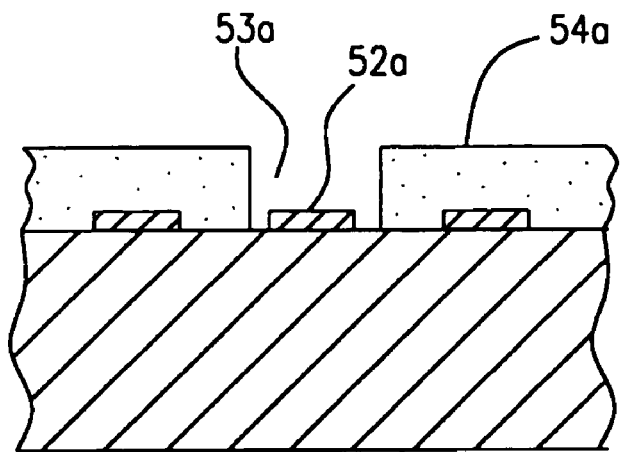
FIG. 1 is a schematic sectional view of a step of a conventional method for manufacturing a multilayer circuit component.
Figure 2:
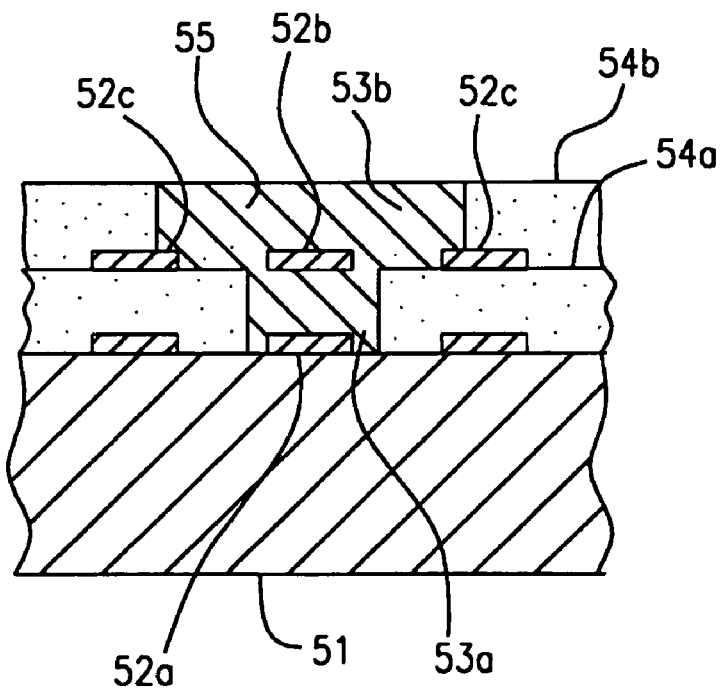
FIG. 2 is a schematic sectional view of a multilayer circuit component produced by the conventional method for manufacturing.
Figure 3:
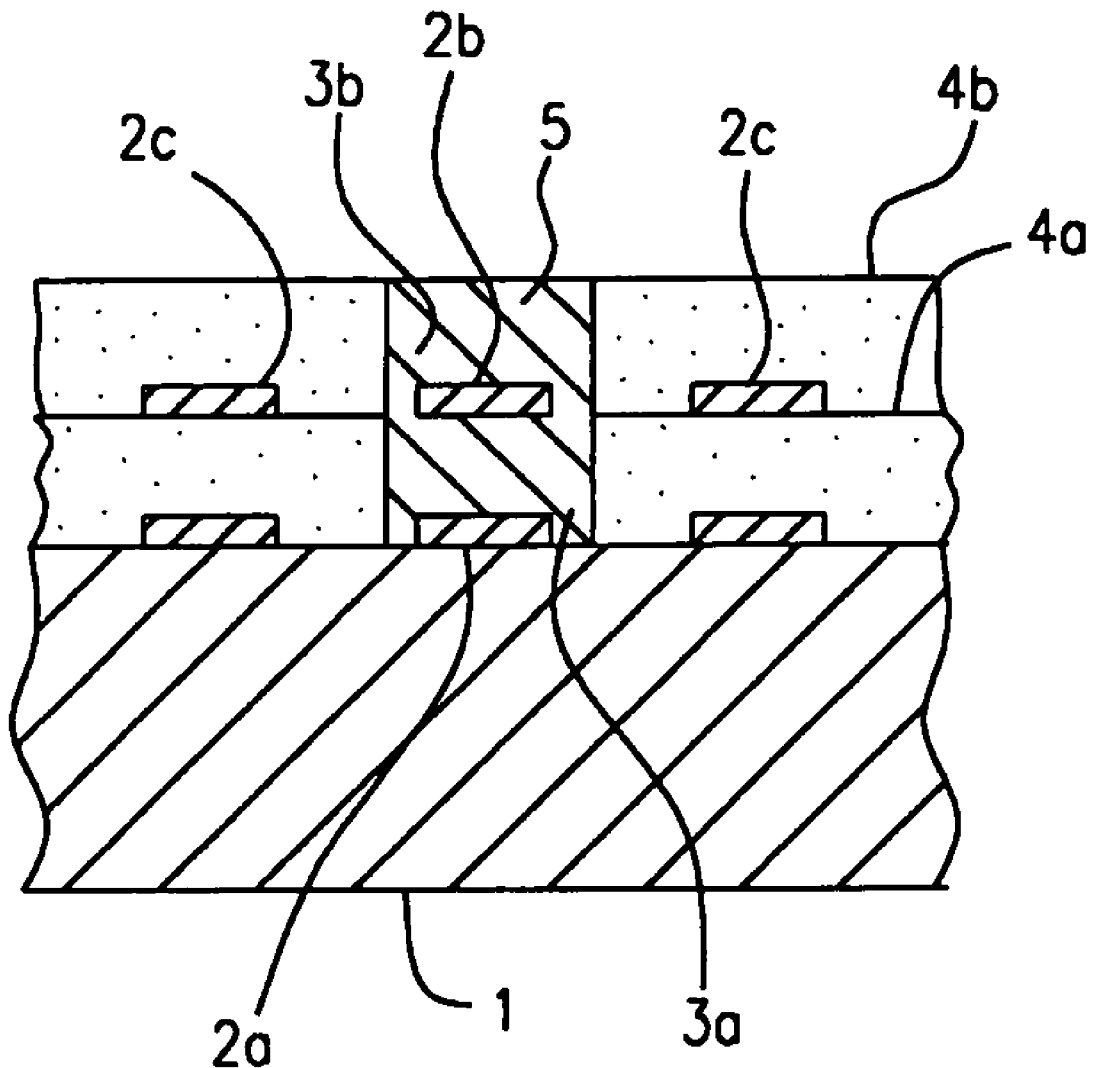
FIG. 3 is a schematic sectional view of a multilayer circuit component according to an embodiment of the present invention.

Herein, as shown in FIG. 3, a multilayer circuit component (herein, laminated coil component) is explained as an example. The multilayer circuit component has a structure in which an insulation layer (a first glass-containing layer) 4a including a via hole 3a is formed on a substrate 1, on which conductor patterns (circuits) 2a are formed, a second glass-containing layer 4b including a via hole 3b is formed on the first glass-containing layer 4a, on which conductor patterns (circuits) 2b and 2c are formed, and the via holes 3a and 3b are filled with a conductor (via hole conductor) 5, so that the conductor patterns 2a and the conductor patterns 2b are connected through the via hole conductor 5. FIG. 3 shows up to the second glass-containing layer 4b, although it is possible to have a structure with an increased number of laminated layers.

(1) An alumina substrate of 10 cm by 10 cm in size having the plane shape of a square is prepared. In the present invention, the kind of the substrate is not specifically limited and various substrates, such as a $SiO_2$ substrate and a glass substrate, other than the alumina substrate, can be used.

(2) A predetermined conductor wiring is formed on the substrate by applying a conductor paste in which an organic vehicle (photosensitive vehicle) and a conductor powder (Ag powder) are compounded in a ratio as shown in Table 2, on the substrate by printing with a predetermined pattern using a screen printing method, and thereafter, by drying and by baking at 800° C. in air.

TABLE 2

| Constituent Material of Conductor Paste | Component | Parts by Weight |
| --- | --- | --- |
| Conductor Powder | Ag | 78 |
|  | Glass Powder | 2 |
| Organic Vehicle | Ethylene Glycol | 18 |
|  | Ethyl Cellulose | 2 |

The conductive material for the conductor wiring is not limited to Ag, and various conductive materials, for example, Au, Pt, Cu, Ni, Pd and W, can be used.

(3) Subsequently, a coating of a glass paste (photosensitive paste) for the first layer having a composition as shown in Table 3 is applied on all over the surface of the baked substrate provided with the conductor wiring by screen printing and is dried.

TABLE 3

|  | Component | Glass Paste for First Layer | Glass Paste for Second Layer |
| --- | --- | --- | --- |
| Inorganic Component | Glass ($SiO_2$:PbO:$K_2O$ = 35:58:7.2, Ts = 650° C.) | 30 | — |
|  | Glass ($SiO_2$:$K_2O$:$B_2O_3$ = 79:2:19, Ts = 780° C.) | — | 30 |
|  | Quartz | 20 | 20 |
| Organic Component | Copolymer of methyl methacrylate and methacrylic acid | 7 | 7 |
|  | Monomer (EO denatured trimethylolpropane triacrylate) | 14 | 14 |
|  | Initiator (2-methyl-1-[4-(methylthio)-phenyl]-2-morpholino propanone-1) | 2 | 2 |
|  | Solvent (ethyl carbitol acetate) | 27 | 27 |

As shown in Table 3, the softening temperature (Ts) of the glass compounded in the glass paste for the first layer is 650° C.

Regarding the glass paste (photosensitive glass paste) for the first layer in the present embodiment, a glass paste in which, as shown in table 3, the glass ($SiO_2$:PbO:$K_2O$=35:58:7.2, Ts=650° C.) and the quartz (ceramic particles) are compounded in a predetermined ratio as inorganic components is used, and in order to prevent the substrate from warping during the sintering, the sintering property and the thermal expansion coefficient are controlled.

(4) Thereafter, an exposure is performed with ultraviolet radiation through a photomask having a pattern of a via hole at which a part of the conductor wiring is exposed, so that the part irradiated by the light is hardened. Subsequently, the via hole is formed by the development with a 0.5% by weight aqueous solution of $Na_2CO_3$, and then baking is performed in air at 800° C., so as to form the insulation layer at the first layer (the first glass-containing layer).

(5) A conductor paste, which is the same as that used for forming the conductor wiring on the substrate in the aforementioned step (2), as shown in Table 2, is applied on the first glass-containing layer by the screen printing using a screen plate with a predetermined pattern, and thereafter, is dried and is baked at 800° C. in air.

As a consequence, the via hole is filled with the conductor and a conductor wiring pattern is formed on the insulation layer, so that the conductor wiring on the first layer and the conductor wiring on the second layer are connected in series.

(6) A glass paste for the second layer having the composition as shown in Table 3 is applied by coating on the surface of the substrate (on the first glass-containing layer) on which the conductor wiring of the second layer is formed.

In this glass paste for the second layer, a glass ($SiO_2$:$K_2O$:$B_2O_3$=79:2:19, Ts=780° C.), having a softening temperature (780° C.) which is higher than the softening temperature (650° C.) of the glass in the glass paste for the first layer is used.

(7) Then, the second glass-containing layer is formed by performing exposure, development and baking under conditions similar to those in the aforementioned (4), that is, under conditions similar to those in the first glass-containing layer, and thereafter, the via hole is filled with the conductor (via hole conductor).

In the case in which a multilayer circuit component having a further increased number of laminated layers is produced, the glass-containing layers are laminated by repeating steps similar to the aforementioned steps, so that the multilayer circuit component having the predetermined number of laminated layers can be produced.

COMPARATIVE EXAMPLE 1

A Multilayer circuit component similar to that in the aforementioned embodiment was produced in a manner and conditions similar to those in the aforementioned embodiment, except that the same glass paste as the glass paste for the first layer as shown in the aforementioned Table 3 was used in all layers.

Evaluation

Regarding the cases in which the multilayer circuit components were produced by the methods according to the aforementioned embodiment and the comparative example, the via hole diameters after the development and after the baking of the first, the second and the third glass-containing layers and the amounts of the warp of the substrates at the time of the formation of each of the first, the second and the third glass-containing layers (the time at which each of the glass-containing layers was baked) are shown in Table 4.

TABLE 4

| | Embodiment | | | Comparative Example 1 | | |
|---|---|---|---|---|---|---|
| | Via Hole Diameter After Development | Via Hole Diameter After Baking | Warp of Substrate | Via Hole Diameter After Development | Via Hole Diameter After Baking | Warp of Substrate |
| First Glass-Containing Layer | 32 μm | 53 μm | 200 μm | 28 μm | 52 μm | 200 μm |
| Second Glass-Containing Layer | 31 μm | 51 μm | 250 μm | 34 μm | 65 μm | 350 μm |
| Third Glass-Containing Layer | 33 μm | 55 μm | 200 μm | 31 μm | 67 μm | 800 μm |

As shown in Table 4, the via hole diameters of the second glass-containing layer and glass-containing layers thereafter in the multilayer circuit component according to the aforementioned comparative example were enlarged by a large extent compared to the via hole diameter of the first glass-containing layer, so that sometimes when the via holes were filled with the conductors, the short circuit between the conductor pattern planned to be connected through the via hole and the adjacent conductor pattern occurred so as to cause a short circuit defect. On the other hand, in the multilayer circuit component according to the aforementioned embodiment, the baking shrinkage rates of the first glass-containing layer and those of the second glass-containing layer and the glass-containing layers thereafter were nearly equivalent, and the via hole diameters of the second glass-containing layer and the glass-containing layers thereafter were nearly equivalent to the via hole diameter of the first glass-containing layer, so that it was verified that the short circuit between the conductor pattern planned to be connected through the via hole and the adjacent conductor pattern was reliably prevented from occurring.

This is because in the multilayer circuit component according to the aforementioned embodiment, a glass having a low softening temperature was used for the first glass-containing layer having inferior wettability relative to the alumina substrate so as to complement the sinterability, and a glass having a higher softening temperature was used for the second glass-containing layer and the glass-containing layers thereafter, which were baked on the glass-containing layer, so as to prevent the sinterability from becoming excessively high, so that the sinterability of the second glass-containing layer and the glass-containing layers thereafter was made to be nearly equivalent to the sinterability of the first glass-containing layer.

Furthermore, as shown in Table 4, the warp of the substrate in the multilayer wiring circuit board according to the aforementioned embodiment was within 300 µm, and, although not specifically shown in Table 4, four layers or more of glass-containing layers could be laminated. In the multilayer circuit component according to the aforementioned comparative example, however, the warp increased with the increase in the number of laminated glass-containing layers, and the warp of the substrate reached 800 µm when the third glass-containing layer was laminated. When the warp of the substrate increased as described above, in the printing of the glass paste, the substrate could not be chucked with a chuck system to mount on the printing stage, so that the number of lamination could not be further increased.

In the aforementioned embodiment, the case in which the alumina substrate was used as the substrate, that is, the case in which the contact angle of the glass constituting the first glass-containing layer relative to the substrate was larger than the contact angle of the glass constituting the second glass-containing layer relative to the first glass-containing layer was explained as an example, although, in the case in which the contact angle of the glass constituting the first glass-containing layer relative to the substrate is smaller than the contact angle of the glass constituting the second glass-containing layer relative to the first glass-containing layer, for example, in the case in which a glass substrate having superior wettability relative to the glass is used as the substrate, the present invention can be also applied. In that case, by adopting the configuration in which the softening temperature of the glass compounded in the first glass-containing layer is higher than the softening temperature of the glass compounded in the second glass-containing layer, the difference in the sintering properties due to the difference between the wettabilities is counterbalanced in a manner similar to that in the aforementioned embodiment, so that it is possible to produce the multilayer circuit component in which the warp of the substrate is reduced and the degree of the enlargement of the via hole diameter of each of the glass-containing layers during baking is uniform.

The present invention is not limited to the aforementioned embodiment regarding other points. The present invention can be variously applied and modified within the scope of the invention regarding the kinds of the multilayer circuit components, the kinds and the compositions of the specified glasses constituting the glass-containing layers, and the kinds and the compositions of the constituent materials of the substrates.

Second Embodiment

Figure 4:
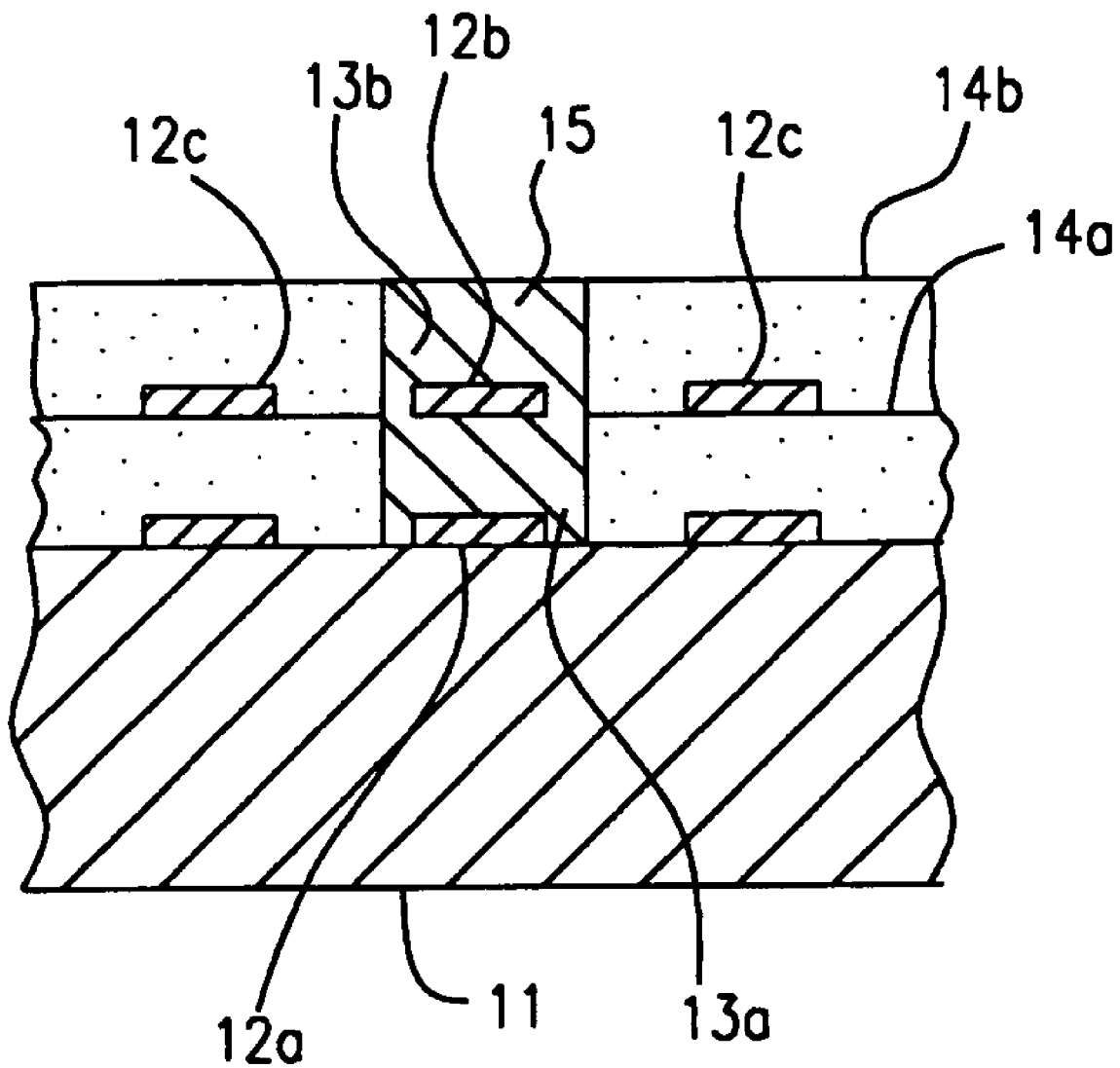
FIG. 4 is a schematic sectional view of a multilayer circuit component according to another embodiment of the present invention.

Herein, as shown in FIG. 4, a multilayer circuit component (herein, laminated coil component) is explained as an example. The multilayer circuit component has a structure in which a first glass-containing layer 14a including a via hole 13a is formed on a substrate 11, on which conductor patterns 12a are formed, a second glass-containing layer 14b including a via hole 13b is formed on the first glass-containing layer 14a, on which conductor patterns 12b and 12c are formed, and the via holes 13a and 13b are filled with a conductor material 15, so that the conductor patterns 12a and the conductor patterns 12b are connected through the via hole conductor 15. FIG. 4 illustrates up to the second glass-containing layer 14b, although it is possible to have a structure with an increased number of laminated layers.

(1) An alumina sintered substrate of 10 cm by 10 cm in size having the plane shape of a square is prepared. In the present invention, the kind of the substrate is not specifically limited and various sintered substrates, such as a $SiO_2$ substrate and a glass substrate, other than the alumina sintered substrate, can be used.

(2) A predetermined conductor wiring is formed on the substrate. The conductor wiring is formed by applying a conductor paste, in which a photosensitive organic vehicle and a Ag powder are compounded in the ratio shown in Table 5, on the substrate by printing with a predetermined pattern using a screen printing method, and thereafter, by drying and by baking at 800° C. in air.

TABLE 5

| Constituent Material of Conductor Paste | Component | Parts by Weight |
|---|---|---|
| Conductor Powder | Ag | 78 |
|  | Glass Powder | 2 |
| Organic Vehicle | Ethylene Glycol | 18 |
|  | Ethyl Cellulose | 2 |

The conductive material for the conductor wiring is not limited to Ag, and various conductive materials, for example, Au, Pt, Cu, Ni, Pd and W, can be used.

(3) Subsequently, all of the surface of the baked substrate provided with the conductor wiring is coated with a glass paste (photosensitive glass paste) for the first layer, in which inorganic components and organic components are compounded in ratios as shown in Table. 6, by the screen printing and is dried.

TABLE 6

|  | Component | Glass Paste for First Layer (parts by weight) | Glass Paste for Second Layer (parts by weight) |
|---|---|---|---|
| Inorganic Component | Glass ($SiO_2$:$K_2O$:$B_2O_3$ = 79:2:19, Ts = 780° C.) | 40 | 35 |
|  | Quartz | 10 | 15 |
| Organic Component | Copolymer of methyl methacrylate and methacrylic acid | 7 | 7 |
|  | Monomer (EO denatured trimethylolpropane triacrylate) | 14 | 14 |
|  | Initiator (2-methyl-1-[4-(methylthio)phenyl]-2-morpholino propanone-1) | 2 | 2 |
|  | Solvent (ethyl carbitol acetate) | 27 | 27 |

As shown in Table 6, the softening temperature (Ts) of the glass compounded in the glass paste for the first layer is 780° C.

Regarding the glass paste (photosensitive glass paste) for the first layer in the present embodiment, an insulation material in which the glass ($SiO_2$:$K_2O$:$B_2O_3$=79:2:19, Ts=780° C.) and the quartz (ceramic particles) are compounded in a predetermined ratio as inorganic components as shown in Table 6, is used, and in order to prevent the substrate from warping during the sintering, the sintering property and the thermal expansion coefficient are controlled.

(4) Thereafter, an exposure is performed with an ultraviolet radiation through a photomask having a pattern of a via hole, at which a part of the conductor wiring is exposed, so that the part irradiated by the light is hardened. Subsequently, the via hole is formed by the development with a 0.5% by weight aqueous solution of $Na_2CO_3$, and then the baking is performed in air at 800° C., so as to form the first glass-containing layer at the first layer.

(5) A conductor paste, which is the same as that used for forming the conductor wiring on the substrate in the aforementioned step (2), as shown in Table 5, is applied on the first glass-containing layer by the screen printing using a screen plate with a predetermined pattern, and thereafter, is dried and is baked at 800° C. in air.

As a consequence, the via hole is filled with the conductor, and a conductor wiring pattern is formed on the insulation layer, so that the conductor wiring on the first layer and the conductor wiring on the second layer are directly connected.

(6) A glass paste for the second layer in which inorganic components and organic components are compounded in ratios as shown in Table. 6, is applied by coating on the surface of the substrate (on the first glass-containing layer), on which the conductor wiring of the second layer is formed.

As this glass paste for the second layer, a glass paste in which the same glass as used for the first layer is compounded at a compounding ratio of 35 part by weight, reduced from 40 part by weight, and the quartz is compounded in a compounding ratio of 15 part by weight, increased from 10 part by weight, is used.

(7) Then, the second glass-containing layer is formed by performing the exposure, the development and the baking under conditions similar to those in the aforementioned (4), that is, under conditions similar to those in the first glass-containing layer, and thereafter, the via hole is filled with the conductor (via hole conductor).

In the case in which a multilayer circuit component having a further increased number of laminated layers is produced, the lamination of the glass-containing layers are performed by repeating steps similar to the aforementioned steps, so that the multilayer circuit component having the predetermined number of laminated layers can be produced.

COMPARATIVE EXAMPLE 2

A multilayer circuit component similar to that in the aforementioned second embodiment was produced in a manner and conditions similar to those in the aforementioned second embodiment, except that the same glass paste as the glass paste for the first layer as shown in the aforementioned Table 6 was used in each layer.

Evaluation

Regarding the cases in which the multilayer circuit components were produced by the method according to the aforementioned first embodiment and the Comparative Example 2, the via hole diameters of after the development and after the baking of the first, the second and the third glass-containing layers and the amounts of the warps of the substrates at the time of the formation of each of the first, the second and the third glass-containing layers (the time at which each of the glass-containing layers was baked) are shown in Table 7.

TABLE 7

|  | First Embodiment | | | Comparative Example 1 | | |
| --- | --- | --- | --- | --- | --- | --- |
|  | Via Hole Diameter After Development | Via Hole Diameter After Baking | Warp of Substrate | Via Hole Diameter After Development | Via Hole Diameter After Baking | Warp of Substrate |
| First Glass-Containing Layer | 30 μm | 52 μm | 150 μm | 26 μm | 49 μm | 200 μm |
| Second Glass-Containing Layer | 28 μm | 49 μm | 250 μm | 32 μm | 67 μm | 400 μm |
| Third Glass-Containing Layer | 28 μm | 48 μm | 200 μm | 31 μm | 70 μm | 900 μm |

As shown in Table 7, the via hole diameters of the second glass-containing layer and glass-containing layers thereafter in the multilayer circuit component according to the aforementioned Comparative Example 2, were enlarged by a large extent compared to the via hole diameter of the first glass-containing layer, so that sometimes, when the via holes were filled with the conductors, a short circuit between the conductor pattern planned to be connected through the via hole and the adjacent conductor pattern occurred so as to cause the short circuit defect. On the other hand, in the multilayer circuit component according to the aforementioned second embodiment, the baking shrinkage rates of the first glass-containing layer and those of the second glass-containing layer and the glass-containing layers thereafter were nearly equivalent, and the via hole diameters of the second glass-containing layer and the glass-containing layers thereafter were nearly equivalent to the via hole diameter of the first glass-containing layer, so that it was verified that a short circuit between the conductor pattern planned to be connected through the via hole and the adjacent conductor pattern was reliably prevented from occurring.

This is because in the multilayer circuit component according to the aforementioned second embodiment, the glass paste having a large glass content was used for the first glass-containing layer having inferior wettability with the alumina substrate so as to complement the sinterability, and the glass pastes having small glass contents were used for the second glass-containing layer and the glass-containing layers thereafter, which were baked on the glass-containing layer, so as to prevent the sinterability from becoming excessively high, and therefore, the sinterability of the second glass-containing layer and the glass-containing layers thereafter was made to be nearly equivalent to the sinterability of the first glass-containing layer.

Furthermore, as shown in Table 7, the warp of the substrate in the multilayer wiring circuit board according to the aforementioned second embodiment was within 250 μm, and, although not specifically shown in Table 7, four layers or more of glass-containing layers could be laminated. In the multilayer circuit component according to the aforementioned Comparative Example 2, however, the warp increased with increase in the number of lamination of the glass-containing layers, and the warp of the substrate reached 900 μm when the third glass-containing layer was laminated. When the warp of the substrate increased as described above, in the printing of the glass paste, the substrate could not be chucked with a chuck system to mount on the printing stage, so that the number of lamination could not be further increased.

Third Embodiment

A multilayer circuit component was produced in a manner similar to that in the aforementioned second embodiment, except that the glass paste for the first layer (photosensitive glass paste) and the glass paste for the second layer, as shown in Table 8, were used as the glass pastes for forming the first glass-containing layer and the second glass-containing layer.

TABLE 8

| | Component | Glass Paste for First Layer (parts by weight) | Glass Paste for Second Layer (parts by weight) |
|---|---|---|---|
| Inorganic Component | Glass ($SiO_2:K_2O:B_2O_3$ = 79:2:19, Ts = 780° C.) | 27 | 29 |
| | Glass ($Bi_2O_3:B_2O_3:Al_2O_3:SiO_2$ = 74:22:3:1, Ts = 495° C.) | 3 | 1 |
| | Quartz | 20 | 20 |
| Organic Component | Copolymer of methyl methacrylate and methacrylic acid | 7 | 7 |
| | Monomer (EO denatured trimethylolpropane triacrylate) | 14 | 14 |
| | Initiator (2-methyl-1-[4-(methylthio)phenyl]-2-morpholino propanone-1) | 2 | 2 |

TABLE 8-continued

| Component | Glass Paste for First Layer (parts by weight) | Glass Paste for Second Layer (parts by weight) |
|---|---|---|
| Solvent (ethyl carbitol acetate) | 27 | 27 |

In the present embodiment, as the glass (compounded glass) constituting the glass paste for the first layer, a compounded glass, in which 27 parts by weight of glass having a composition of $SiO_2:K_2O:B_2O_3$=79:2:19 and the glass softening temperature (Ts) of 780° C. and 3 parts by weight of glass having a composition of $Bi_2O_3:B_2O_3:Al_2O_3:SiO_2$=74:22:3:1 and a glass softening temperature (Ts) of 495° C. were compounded, was used.

As the glass paste for the second layer, a compounded glass, in which 29 parts by weight of glass having a composition of $SiO_2:K_2O:B_2O_3$=79:2:19 and the glass softening temperature (Ts) of 780° C. and 1 part by weight of glass having a composition of $Bi_2O_3:B_2O_3:Al_2O_3:SiO_2$=74:22:3:1 and a glass softening temperature (Ts) of 495° C. were compounded, was used.

COMPARATIVE EXAMPLE 3

A multilayer circuit component similar to that in the aforementioned second embodiment was produced in a manner and conditions similar to those in the aforementioned third embodiment, except that the same glass paste as the glass paste for the first layer, as shown in the aforementioned Table 8, was used in all layers.

Evaluation

Regarding the cases in which the multilayer circuit components were produced by the method according to the aforementioned third embodiment and the Comparative Example 3, the via hole diameters of after the development and after the baking of the first, the second and the third glass-containing layers and the amounts of the warps of the substrates at the time of the formation of each of the first, the second and the third glass-containing layers (the time at which each of the glass-containing layers was baked) are shown in Table 9.

TABLE 9

| | Second Embodiment | | | Comparative Example 2 | | |
|---|---|---|---|---|---|---|
| | Via Hole Diameter After Development | Via Hole Diameter After Baking | Warp of Substrate | Via Hole Diameter After Development | Via Hole Diameter After Baking | Warp of Substrate |
| First Layer | 34 μm | 55 μm | 250 μm | 30 μm | 52 μm | 200 μm |
| Second Layer | 28 μm | 51 μm | 300 μm | 34 μm | 70 μm | 450 μm |
| Third Layer | 30 μm | 53 μm | 200 μm | 31 μm | 85 μm | 950 μm |

As shown in Table 9, the via hole diameters of the second glass-containing layer and glass-containing layers thereafter in the multilayer circuit component according to the aforementioned Comparative Example 3 were enlarged by a large extent compared to the via hole diameter of the first glass-containing layer, so that sometimes when the via holes were filled with the conductors, a short circuit between the conductor pattern planned to be connected through the via hole and the adjacent conductor pattern occurred so as to cause the short circuit defect. On the other hand, in the multilayer circuit component according to the aforementioned third embodiment, the baking shrinkage rates of the first glass-containing layer and those of the second glass-containing layer and the glass-containing layers thereafter were nearly equivalent, and the via hole diameters of the second glass-containing layer and the glass-containing layers thereafter were nearly equivalent to the via hole diameter of the first glass-containing layer, so that it was verified that a short circuit between the conductor pattern planned to be connected through the via hole and the adjacent conductor pattern was reliably prevented from occurring.

This is because in the multilayer circuit component according to the aforementioned third embodiment, the compounded glass having a large compounding ratio of glass, which has a low softening temperature as 495° C., was used for the first glass-containing layer having inferior wettability with the alumina substrate so as to complement the sinterability, and the compounded glass having a small compounding ratio of glass which has a low softening temperature as 495° C., was used for the second glass-containing layer and the glass-containing layers thereafter, which were baked on the glass-containing layer, so as to prevent the sinterability from becoming excessively high, and therefore the sinterability of the second glass-containing layer and the glass-containing layers thereafter could be made nearly equivalent to the sinterability of the first glass-containing layer.

Furthermore, as shown in Table 9, the warp of the substrate in the multilayer wiring circuit board according to the aforementioned second embodiment was within 300 μm, and, although not specifically shown in Table 9, four layers or more of glass-containing layers could be laminated. In the multilayer circuit component according to the aforementioned Comparative Example 3, however, the warp increased with increase in the number of lamination of the glass-containing layers, and the warp of the substrate reached 950 μm when the third glass-containing layer was laminated, and it was difficult to laminate four layers or more.

Fourth Embodiment

A multilayer circuit component was produced in a manner similar to that in the aforementioned third embodiment, except that the glass paste for the first layer (photosensitive glass paste) and the glass paste for the second layer as shown in Table 10 were used as the glass pastes for forming the first glass-containing layer and the second glass-containing layer.

TABLE 10

| | Component | Glass Paste for First Layer (parts by weight) | Glass Paste for Second Layer (parts by weight) |
|---|---|---|---|
| Inorganic Component | Compounded Glass Glass ($SiO_2$:$K_2O$:$B_2O_3$ = 79:2:19, Ts = 780° C.): | 30 | 27 |

TABLE 10-continued

| | Component | Glass Paste for First Layer (parts by weight) | Glass Paste for Second Layer (parts by weight) |
|---|---|---|---|
| | Glass ($Bi_2O_3$:$B_2O_3$: $Al_2O_3$:$SiO_2$ = 74:22:3:1, Ts = 495° C.) = 9:1 (weight ratio) | | |
| | Quartz | 20 | 23 |
| Organic Component | Copolymer of methyl methacrylate and methacrylic acid | 7 | 7 |
| | Monomer (EO denatured trimethylolpropane triacrylate) | 14 | 14 |
| | Initiator (2-methyl-1-[4-(methylthio)phenyl]-2-morpholino propanone-1) | 2 | 2 |
| | Solvent (ethyl carbitol acetate) | 27 | 27 |

In the aforementioned fourth embodiment, as shown in Table 10, a glass paste, containing a compounded glass, in which a glass having a composition of $SiO_2$:$K_2O$:$B_2O_3$=79:2:19 and a glass softening temperature (Ts) of 780° C. and a glass having a composition of $Bi_2O_3$:$B_2O_3$:$Al_2O_3$:$SiO_2$=74:22:3:1 and a glass softening temperature (Ts) of 495° C. were compounded in a weight ratio 9:1, was used as the glass (compounded glass) constituting the glass paste for the first layer at a content of 30 parts by weight.

A glass paste containing a compounded glass which has the same composition as that in the glass paste for the first layer was used as the glass (compounded glass) constituting the glass paste for the second layer at a content of 27 parts by weight.

COMPARATIVE EXAMPLE 4

A multilayer circuit component similar to that in the aforementioned third embodiment was produced in a manner and conditions similar to those in the aforementioned third embodiment, except that the same glass paste as the glass paste for the first layer as shown in the aforementioned Table 10 was used in all layers. Comparative Example 4 is the same as the multilayer circuit component in the aforementioned Comparative Example 3.

Evaluation

Regarding the cases in which the multilayer circuit components were produced by the method according to the aforementioned fourth embodiment and the Comparative Example 4, the via hole diameters of after the development and after the baking of the first, the second and the third glass-containing layers and the amounts of the warps of the substrates at the time of the formation of each of the first, the second and the third glass-containing layers (the time at which each of the glass-containing layers was baked) are shown in Table 11.

TABLE 11

|  | Third Embodiment | | | Comparative Example 3 (=Comparative Example 2) | | |
| --- | --- | --- | --- | --- | --- | --- |
|  | Via Hole Diameter After Development | Via Hole Diameter After Baking | Warp of Substrate | Via Hole Diameter After Development | Via Hole Diameter After Baking | Warp of Substrate |
| First Layer | 33 μm | 56 μm | 250 μm | 30 μm | 52 μm | 200 μm |
| Second Layer | 28 μm | 53 μm | 250 μm | 34 μm | 70 μm | 450 μm |
| Third Layer | 29 μm | 51 μm | 200 μm | 31 μm | 85 μm | 950 μm |

As shown in Table 11, the via hole diameters of the second glass-containing layer and glass-containing layers thereafter in the multilayer circuit component according to the aforementioned Comparative Example 3 were enlarged by a large extent compared to the via hole diameter of the first glass-containing layer, so that sometimes when the via holes were filled with the conductors, a short circuit between the conductor pattern planned to be connected through the via hole and the adjacent conductor pattern occurred so as to cause the short circuit defect. On the other hand, in the multilayer circuit component according to the aforementioned fourth embodiment, the baking shrinkage rates of the first glass-containing layer and those of the second glass-containing layer and the glass-containing layers thereafter were nearly equivalent, and the via hole diameters of the second glass-containing layer and the glass-containing layers thereafter were nearly equivalent to the via hole diameter of the first glass-containing layer, so that it was verified that a short circuit between the conductor pattern planned to be connected through the via hole and the adjacent conductor pattern was reliably prevented from occurring.

This is because in the multilayer circuit components according to the aforementioned second to fourth Embodiments, the compounded glasses were sufficiently contained in the first glass-containing layers having inferior wettability with the alumina substrate so as to complement the sinterability, and the contents of the compounded glasses were made to be small in the second glass-containing layer and the glass-containing layers thereafter, which were baked on the glass-containing layer, so as to prevent the sinterability from becoming excessively high, and therefore, the sinterability of the second glass-containing layer and the glass-containing layers thereafter could be made nearly equivalent to the sinterability of the first glass-containing layer.

Furthermore, as shown in Table 11, the warp of the substrate in the multilayer wiring circuit board according to the aforementioned third embodiment was within 250 μm, and, although not specifically shown in Table 11, four layers or more of glass-containing layers could be laminated. In the multilayer circuit component according to the aforementioned Comparative Example 4, however, the warp increased with increase in the number of lamination of the glass-containing layers, and the warp of the substrate reached 950 μm when the third glass-containing layer was laminated, and it was difficult to laminate four layers or more.

In each of the aforementioned second to fourth embodiments, an alumina substrate was used as the substrate, that is, the case in which the contact angle of the glass constituting the first glass-containing layer relative to the substrate was larger than the contact angle of the glass constituting the second glass-containing layer relative to the first glass-containing layer was explained as an example, although, in the case in which a glass substrate having superior wettability with the glass is used as the substrate, that is, in the case in which the contact angle of the glass constituting the first glass-containing layer relative to the substrate is smaller than the contact angle of the glass constituting the second glass-containing layer relative to the first glass-containing layer, the present invention can also be applied. By controlling the glass composition, the amount of the glass, etc., of the first glass-containing layer within the range of the present invention, so as to prevent the sinterability from becoming excessively high, and by controlling the glass compositions, the amounts of the glasses, etc., of the second glass-containing layer and the glass-containing layers thereafter, which are baked on the glass-containing layers, within the range of the present invention, so as to complement the sinterability, the sinterability of the second glass-containing layer and the glass-containing layers thereafter can be made nearly equivalent to the sinterability of the first glass-containing layer, and the functional effects similar to those in the aforementioned first to third embodiments can be produced.

The present invention is not limited to the aforementioned embodiments regarding other points. The present invention can be variously applied and modified within the scope of the invention regarding the kinds of the multilayer circuit components, the kinds and the compositions of the specified glasses constituting the glass-containing layers, and the kinds and the compositions of the constituent materials of the substrates.

What is claimed is:

1. A method for manufacturing a multilayer circuit component which comprises at least two glass-containing layers on a substrate, in which the baking shrinkage rates of the first glass-containing layer and second glass-containing layer formed are about the same, comprising:
    (a) applying and drying a first photosensitive glass paste comprising glass having a softening temperature and a photosensitive vehicle to a substrate;
    (b) forming a via hole pattern on the resulting dried first paste;
    (c) baking the resulting paste with said via hole pattern so as to form a first glass-containing layer;
    (d) applying and drying a second photosensitive glass paste comprising glass having a softening temperature and a photosensitive vehicle, on said first glass-containing layer;
    (e) forming a via hole pattern on the resulting dried second paste; and
    (f) baking the resulting second paste with said via hole pattern so as to form a second glass-containing layer;

wherein at least one parameter selected from glass softening temperature and glass content in the first glass paste is different from the same parameter in the second glass paste, whereby the baking shrinkage rates of the first glass-containing layer and second glass-containing layer formed are about the same.

2. A method for manufacturing a multilayer circuit component according to claim 1, wherein the glass softening temperature parameter in the first glass paste is different from the glass softening temperature parameter in the second glass paste.

3. A method for manufacturing a multilayer circuit component according to claim 2, wherein the glasses in the pastes are such that the glass of the first glass-containing layer has a contact angle relative to said substrate which is larger than the contact angle of the glass of the second glass-containing layer relative to said first glass-containing layer; and the softening temperature of the glass in the first photosensitive glass paste is lower than the softening temperature of the glass in the second photosensitive glass paste.

4. A method for manufacturing a multilayer circuit component according to claim 2, wherein the glasses in the pastes are such that the glass of the first glass-containing layer has a contact angle relative to said substrate which is smaller than the contact angle of the glass of the second glass-containing layer relative to said first glass-containing layer; and the softening temperature of the glass in the first photosensitive glass paste is higher than the softening temperature of the glass in the second photosensitive glass paste.

5. A method for manufacturing a multilayer circuit component according to claim 2, wherein the difference between the softening temperature of the glass in the first photosensitive glass paste and the softening temperature of the glass in the second photosensitive glass paste is at least about 30° C.

6. A method for manufacturing a multilayer circuit component according to claim 1, wherein the glass content in the first glass paste is different from the glass content in the second glass paste.

7. A method for manufacturing a multilayer circuit component according to claim 6, wherein the first and second photosensitive glass pastes each comprise low softening temperature glass and the low softening temperature glass content in the first and second photosensitive glass pastes are different.

8. A method for manufacturing a multilayer circuit component according to claim 7, wherein the first and second photosensitive glass pastes each comprise ceramic.

9. A method for manufacturing a multilayer circuit component according to claim 1, wherein the glass in each of the first and second photosensitive glass pastes comprise low softening temperature glass.

10. A method for manufacturing a multilayer circuit component according to claim 1, wherein the glass in the first photosensitive glass paste comprises low softening temperature glass.

11. A method for manufacturing a multilayer circuit component according to claim 1, wherein the first and second photosensitive glass pastes each comprise ceramic.

12. A method for manufacturing a multilayer circuit component according to claim 11, wherein the substrate is a glass-free ceramic.

13. A method for manufacturing a multilayer circuit component according to claim 12, wherein the glass in the first photosensitive glass paste comprises low softening temperature glass.

14. A method for manufacturing a multilayer circuit component according to claim 13, wherein the glass in the second photosensitive glass paste comprises low softening temperature glass.

15. A method for manufacturing a multilayer circuit component according to claim 14, wherein the glass content in the first glass paste is different from the glass content in the second glass paste.

16. A method for manufacturing a multilayer circuit component according to claim 14, wherein the glass softening temperature parameter in the first glass paste is different from the glass softening temperature parameter in the second glass paste.

17. A method for manufacturing a multilayer circuit component according to claim 16, wherein the glass softening temperature parameters differ be at least about 30° C.

18. A method for manufacturing a multilayer circuit component according to claim 1, wherein the substrate is a glass-free ceramic.

19. A method for manufacturing a multilayer circuit component according to claim 18, wherein the glass content in the first glass paste is different from the glass content in the second glass paste.

20. A method for manufacturing a multilayer circuit component according to claim 19, wherein the in the first glass paste is different from the glass in the second glass paste.

* * * * *